United States Patent [19]

Long

[11] Patent Number: 5,283,596
[45] Date of Patent: Feb. 1, 1994

[54] DIGITALLY SYNTHESIZED GRAY SCALE FOR RASTER SCAN OSCILLOSCOPE COLOR DISPLAY OF OVERLAPPING MULTICHANNEL WAVEFORMS

[75] Inventor: David W. Long, Colorado Springs, Colo.

[73] Assignee: Hewlett-Packard Company, Palo Alto, Calif.

[21] Appl. No.: 891,489

[22] Filed: May 29, 1992

Related U.S. Application Data

[63] Continuation-in-part of Ser. No. 650,833, Feb. 5, 1991, Pat. No. 5,254,983.

[51] Int. Cl.$^5$ .............................................. G09G 1/14
[52] U.S. Cl. .................................... 345/134; 345/153; 345/147
[58] Field of Search ............... 340/793, 767, 703, 701, 340/747, 799; 324/121 R; 364/48 T; 358/22, 183; H04N 9/74, 5/262, 5/272

[56] References Cited

U.S. PATENT DOCUMENTS

| | | | |
|---|---|---|---|
| 4,165,506 | 8/1979 | Brands et al. | 340/799 |
| 4,223,353 | 9/1980 | Keller et al. | 340/793 |
| 4,233,631 | 11/1980 | Mahler | 358/182 |
| 4,504,827 | 3/1985 | Hanson et al. | 340/793 |
| 4,555,765 | 11/1985 | Crooke | 364/571 |
| 4,586,036 | 4/1986 | Thomason et al. | 340/703 |
| 4,626,835 | 12/1986 | Nienaber et al. | 340/703 |
| 4,694,244 | 9/1987 | Whiteside | 324/121 |
| 4,694,286 | 9/1987 | Bergstedt | 340/703 |
| 4,809,189 | 2/1989 | Batson | 364/487 |
| 4,829,293 | 5/1989 | Schlater | 340/747 |
| 4,940,931 | 7/1990 | Katayama | 340/793 |

OTHER PUBLICATIONS

Yokogawa Electric Corporation Instruction Manual, DL 1200A IM 7006—01U, 4th Edition, Feb. 1991.

Primary Examiner—Ulysses Weldon
Assistant Examiner—Xiao M. Wu

[57] ABSTRACT

A gray scale binary field corresponding to each of the pixels on a raster scan oscilloscope display. Each gray scale binary field has a portion of its bits assigned to correspond to the graphical information and a portion of its bits assigned to correspond to the sampled current and prior waveforms. A decrementing state machine, in a predetermined cycle of operation, periodically reads all of the gray scale binary fields in the display memory of the oscilloscope, decrements each value by a predetermined amount such as the binary value of one, and re-writes the decremented binary values back into the display memory. As these decremented gray scale binary fields are displayed, the older waveforms become uniformly more faded with the oldest waveform having the dimmest illumination. In a typical mode of operation, the predetermined cycle of operation corresponds to the sampling of each new waveform from the system under test so that each subsequent prior waveform is decremented by the predetermined amount.

9 Claims, 13 Drawing Sheets

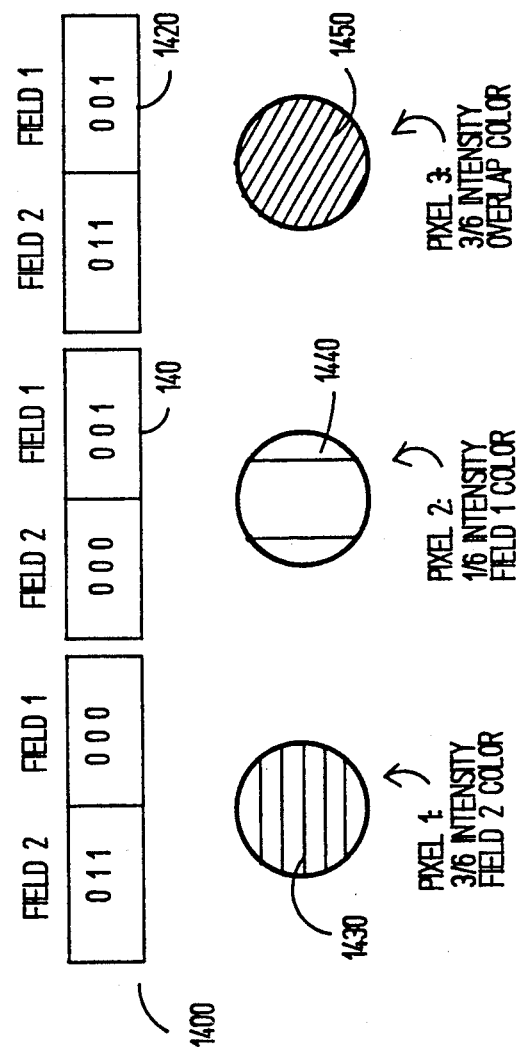

DIGITALLY SYNTHESIZED GRAY SCALE FOR RASTER SCAN OSCILLOSCOPE COLOR DISPLAY OF OVERLAPPING MULTICHANNEL WAVEFORMS

This is a continuation-in-part of copending application Ser. No. 07/650,833 filed on Feb. 5, 1991, now U.S. Pat. No. 5,254,983.

BACKGROUND OF THE INVENTION

1. Field of the Invention

The present invention pertains to raster scan displays and, more particularly, to digitally synthesizing a gray scale for raster scan oscilloscope multichannel color displays including overlap control of such displays.

2. Statement of the Problem

Signal waveforms when viewed on oscilloscope displays are not always stable, single valued functions. Rather, the signals may shift in amplitude and/or time from one sweep of the screen to the next sweep. The term "sweep" herein refers to the act of displacement of an electron beam across the phosphor coating on the inside of a cathode-ray tube display causing the phosphor to glow and to emit light.

The "gray scale" effect on an analog oscilloscope display refers to the condition of the most recently drawn waveform data being the brightest waveform on the display. Waveforms from the recent past sweeps show up in various "shades of gray" depending on how long the waveform has been on the screen. The term "gray scale" herein is defined as discrete steps of brightness between light and dark. The gray scale effect occurred in analog oscilloscopes due to the behavior of the phosphor coating. The phosphor would glow at full brightness when a waveform was initially drawn, and then would fade (unless redrawn).

The gray scale effect on analog oscilloscopes conveyed useful information to a user of the oscilloscope. The user could determine both the current value of the waveform (i.e., from the current sweep) and values it had taken on during the prior sweeps. For example, in FIG. 1 a waveform being observed in the oscilloscope may undergo a minimum amplitude $A_{min}$ (as shown in FIG. 1a) or a maximum amplitude $A_{max}$ (as shown in FIG. 1b). The resultant combined image as seen on an analog oscilloscope display is shown in FIG. 1c. Waveform 10 is the waveform from the current sweep (hence, full brightness), waveform 20 was drawn during the last sweep (hence, almost full brightness), waveform 30 was drawn from a previous sweep (hence, dimly lit). The waveforms from other sweeps are also shown and all of these waveforms taken together result in a gray scale envelope 40 collectively placing the waveforms of varying degrees of brightness within a range of amplitude values ($A_{min}$-$A_{max}$).

The useful information contained in FIG. 1 includes an indication to the user of the analog oscilloscope that the waveform has a current direction 50 of change as shown in FIG. 1c. The sweep frequency (i.e., the sweep repetition rate) and the oscillation by the waveform 100 between $A_{min}$ and $A_{max}$ determines what is viewed on the screen as shown by FIG. 1c. For example, if the oscillation between amplitude values occurred at a sufficiently high rate so that the phosphor did not fade to black between refreshes, the user could see the full range of values that the waveform took provided the sweep frequency was fast enough. On the other hand, if the oscillations occurred at an extremely high rate of repetition, the user would only see the most common amplitude values for the waveform. For example, if waveform 100 spent a larger percentage of its oscillation cycle time at $A_{max}$ then at $A_{min}$, the outer edges 60 of the gray scale envelope 40 would appear brighter to the user. This is simply due to the fact that the phosphor is excited more often at the outer edges 60 and therefore maintains a higher average level of light output.

While the above was a characteristic of analog oscilloscopes, modern digitizing oscilloscopes do not provide the user with the type of gray scale information described above. Rather, modern digitizing oscilloscopes digitize the waveform into a set of discrete values which are then written into a display memory. The display memory holds an image which is copied to the actual display. The image is copied repetitively to the display and continues to be refreshed until the image changes. This is illustrated in FIG. 2.

In FIG. 2, a display memory 200 contains the binary information in the form of ones and zeros. For example, in FIG. 2, the display memory 200 has bit pattern 210 which corresponds to a display pattern 220 on a screen 230. The binary one corresponds to an illuminated dot 240. This is graphically shown by arrows 250 and 260. Hence, individual display dots (or pixels) on screen 230 are either on or off and, to the human user, there is no intermediate brightness values which correspond to provide gray scale information. A need exists to provide corresponding gray scale information to the user of a digitizing oscilloscope.

One technique utilized in digitizing oscilloscopes is a feature called "variable persistence" which attempts to provide some gray scale information. This feature allows the user to specify how long a data point should stay on screen after it has been drawn. This is simply accomplished by having the microprocessor control determine how long a bit should stay set in display memory 200, with the length of time being controlled by the user. When the preset amount of time has passed, the microprocessor then clears the bit in the display memory which has the effect of erasing the dot from the display. In digitizing oscilloscopes, because the phosphor fades from full brightness to off quickly, the data points appear to the user as either being full bright on or off. The "variable persistence feature" simply increases the density (i.e., quantity) of dots fully illuminated on the screen. Hence, there is a greater dot density at the more recent locations of the waveform and a lesser dot density at the less recent locations of the waveform.

There are clear disadvantages to the "variable persistence feature. A major disadvantage is that all data points are illuminated to the same brightness under this technique. This actually hides information from the user i two ways. First, in order to see a display of the full range of values of the waveform (i.e., between $A_{min}$ and $A_{max}$), the user of the oscilloscope generally may have to set the persistence time to a relatively long value depending on how fast the waveform changes. The result is that all data points in the waveform range are illuminated at the same level of brightness. It is not possible to visually determine the current value of the waveform or whether the waveform tends to spend more time at some locations than others. Secondly, if the user reduces the persistence time so that the current value of the waveform can be viewed, the user will not be able to view the full range of values the waveform may take. This depends on how quickly the waveform is changing. Hence, a short persistence time could eliminate part of the waveform envelope in favor of showing the current value.

Another major disadvantage of the variable persistence method is that the display tends to be covered with a spray of illuminated dots as the waveform changes shape. Because all of the waveform data points are plotted at the same light intensity, the true shape of the waveform may be difficult to determine. It is difficult to determine which set of illuminated dots relate to which trace of the waveform. A good example is a frequency modulated waveform. The waveform itself is a sine wave but its frequency changes. On current variable persistence oscilloscopes, the change from a minimum frequency sine wave to a maximum frequency sine wave creates a solid band of dots on the screen. While the envelope showing the full range of values is created, the waveform shape is difficult to determine in the band of dots.

A final disadvantage is that the waveform shown on a digital oscilloscope display does not qualitatively look like the waveform drawn on an analog oscilloscope display. It is difficult for a digital display user to extract the type of gray scale information therefrom.

A need, therefore, exists to provide digitizing oscilloscopes with the capability of providing gray scale information as found in analog oscilloscopes. A need also exists for providing multichannel gray scale colored displays with special display emphasis for the displaying overlap pixels. For example, the Hewlett Packard Model 54720A oscilloscope has four waveform acquisition channels.

3. Prior Patented Approaches

U.S. Pat. No. 4,829,293 owned by the assignee of the present invention sets forth a method and apparatus for achieving variable and infinite persistence. This illustrates the conventional persistence discussed above.

U.S Pat. No. 4,504,827 sets forth a dynamic synthetic persistence for raster scan displays. In this approach, pseudorandom decrementation of the intensity of data which is displayed on a raster screen occurs. This is achieved by randomly selecting the data and randomly varying the times at which the data is decremented. The '827 patent presents a three bit code per pixel. The decrement logic which is provided decrements by one each selected three bit pixel code. The partially decremented code is written back into the memory banks. The operator is able to manually select a desired rate of decay. This is a variation on the synthetic persistence approach discussed above and does not simulate the gray scale effect of an analog oscilloscope display because there is no correlation between the time the waveform is on screen and brightness. The '827 approach is dynamic, in that, the random decrementing occurs as the data is being delivered for display.

A need exists to simulate the gray scale effect of an analog oscilloscope wherein all data for a waveform sweep drawn at a given time fades at a constant rate. In other words, the gray scale effect must be a time correlated fade. In the '827 patent this does not occur since all data points are erased pseudorandomly.

A need exists to uniformly fade the data for waveforms in a multichannel oscilloscope but not to fade other portions of the display carrying graphics information such as scales (graticules), text, etc. A need also exists to display pixels of overlapping waveforms in a different color which can either be of constant illumination such as a graticule or which also fades. A further need exists to provide decrementation to the data independently of the delivery of the data to the display.

4. Solution to the Problem

The present invention is a solution to the above problem by providing a digitally synthesized gray scale apparatus and method for digital oscilloscopes which cause the waveform data points to fade from the display as time passes. The fade rate is constant for all waveform points displayed based upon the historic sweep. Under the teachings of the present invention, the waveform data points for the current waveform are drawn on the oscilloscope display as full brightness dots. As time passes, the brightness of the dots having the same historic display time decrease until the dots are completely off or until they are redrawn at full brightness. The present invention provides its decrementation independently of the display of the data, but does not decrement graphics information (i.e., non-waveform) on the display.

The present invention also provides multichannel display capability with special display emphasis on display of the overlap pixels.

SUMMARY OF THE INVENTION

The present invention constitutes an improvement to a digitizing oscilloscope. Digitizing oscilloscopes comprise two portions. The first portion obtains waveforms from a system or device under test and the second portion of the digitizing oscilloscope displays the current sampled waveform and a number of prior waveforms. The current and prior waveforms are formed by pixels illuminated on a display. The display, in addition to illuminating the sampled waveforms, also provides graphical information.

The present invention provides a gray scale binary field corresponding to each of the pixels on the display. Each gray scale binary field has a portion of its bits assigned to correspond to the graphical information and a portion of its bits assigned to correspond to the sampled current and prior waveform information. A decrementing state machine, in a predetermined cycle of operation, periodically reads all of the gray scale binary fields in the display memory of the oscilloscope, decrements each value by a predetermined amount such as the binary value of one, and re-writes the decremented binary values back into the display memory. As these decremented gray scale binary fields are displayed, the older waveforms become uniformly more faded with the oldest waveform having the dimmest illumination. In a typical mode of operation, the predetermined cycle of operation corresponds to the sampling of each new waveform from the system under test so that each subsequent prior waveform is decremented by the predetermined amount.

In order to minimize flicker, the first prior waveform is still illuminated at full brightness, along with the current waveform. However, the second prior waveform and all older prior waveforms, under the teachings of the present invention, linearly fade in illumination.

The present invention provides a different color for each different input waveform channel of a digital oscilloscope. The prior and current waveforms for each channel are designed to fade and in the event waveforms from different channels overlap, the overlapping pixels are displayed with an overlap color. In a first embodiment, the overlapped color is of constant brilliance such as utilized for display of graticules and, in a second embodiment, the overlapping color is displayed with a fade intensity corresponding to one of the overlapping wave forms. In the preferred embodiment, the overlapping pixel is displayed in an illumination corresponding to the intensity of the newest overlapping waveform.

DESCRIPTION OF THE DRAWING

FIG. 15 sets forth a second preferred embodiment wherein the overlapped pixel is displayed at the intensity of the newest waveform of the overlapping waveforms.

DETAILED DESCRIPTION OF THE INVENTION

Figure 3:
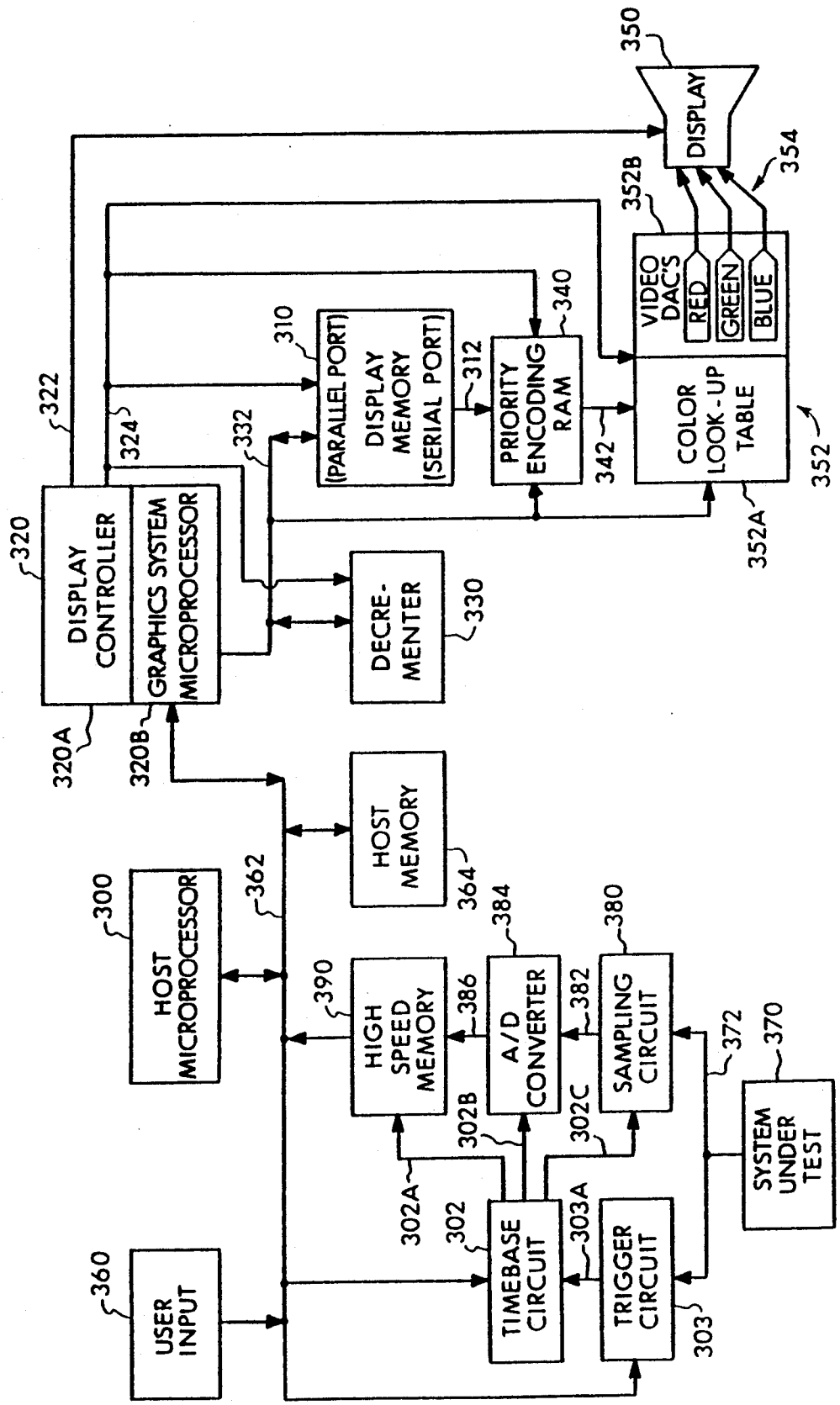
FIG. 3 sets forth the block diagram of the digitizing oscilloscope of the present invention.

In FIG. 3, the system components of the present invention are set forth to include a host microprocessor 300, a display memory 310, a display control (including a display controller 320A and a graphics system microprocessor 320B), a decrementer state machine 330, a priority encoding random access memory (RAM) 340, and a color palette 352 (including a color look-up table 352A and a video digital to analog converter 352B) connected to a display 350.

The digitizing oscilloscope of FIG. 3 obtains signals from a system or device under test 370 by inputting signals through a sampling circuit 380. Circuit 380 conventionally samples the signal appearing on lines 372 and delivers the sampled signal on line 382 to the analog to digital (A/D) converter 384 which then delivers the digital input signal for storage in a high speed memory 390 over lines 386.

The host microprocessor 300 obtains the digital input signal stored in the high speed memory 390 over the host system bus 362 for processing and updating the host memory 364. The host microprocessor 300 controls the display control 320 over bus 362. The host microprocessor 300 receives inputs from the user input 360 over the host system bus 362 and further stores/receives data in the host memory 364.

The graphics system microprocessor 320B enters new waveform data into the display memory 310 over the graphics system bus 332, and controls the decrementer 330 over the same bus. The graphics system microprocessor also accesses the priority encoding RAM 340 and the color palette 352 over bus 332. The display controller 320A controls the display memory 310, the priority encoding RAM 340 and the color palette 352 over lines 324. The display controller 320 also accesses the decrementer 330 over lines 324.

The information being displayed is delivered from the display memory 310 over bus 312 to the priority encoding RAM 340, thence to the color palette 352 over lines 342 and finally to the display 350 over lines 354. It is to be expressly understood that the system components of FIG. 3 are presented in a global fashion. In the conventional raster scan display system, the display control 320 continuously reads the display memory 310 to deliver the coded display information from the display memory 310 to the display 350. The display memory 310 is typically read and its contents redrawn on the screen 350 about sixty times per second (i.e., in the preferred embodiment the period is 16.680 milliseconds).

Also shown in FIG. 3 is the timebase circuit 302 and the trigger circuit 303. Both are connected to bus 362 and are under control of the host microprocessor 300. The timebase circuit 302 provides timing for the high speed memory 390, the A/D converter 384, and the sampling circuit 380 over lines 302A, 302B, and 302C respectively. The trigger circuit 303 is connected to the timebase 302 by line 303A and receives the signals from the system under test 370. The timebase 302 and trigger 303 actually control the sampling circuit 380, the A/D converter 384, and the high speed memory 390. The microprocessor 300 programs the timebase 302 and trigger 303 to acquire the desired conventional channels 372 of waveforms from the system under test 370. The input signals over conventional channels 372 are fed into the trigger circuit 303 as well as into the sampling circuit 380. When the signal meets certain conditions (as specified by the user and as programmed by the microprocessor 300) the trigger circuit 303 "triggers" the timebase circuit 302. This causes the timebase circuit 302 to run and control acquisition of the current waveform from each conventional waveform acquisition channel 372. The timebase 302 actually tells the sampler 380 to take a sample, tells the A/D converter 384 to digitize that sample, and causes the digitized sample value to be written into the high speed memory 390. The timebase causes samples from each conventional waveform acquisition channel 372 to be taken at evenly spaced time intervals until the high speed memory is full.

In the preferred embodiment the host microprocessor 300 is a Motorola 68020 and the graphics system microprocessor 320B is a Texas Instruments Graphics System Processor Chip Model TMS34010. The color palette 352 is conventionally available from Brooktree, Part No. BT471.

1. Decrementer State Machine 330 Operation

Figure 1A:
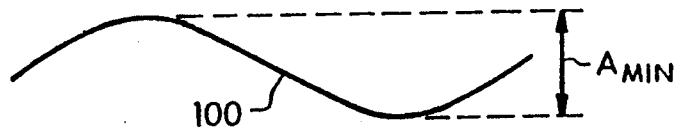
FIGS. 1A–1C sets forth prior art images as seen on an analog oscilloscope display.
Figure 1B:
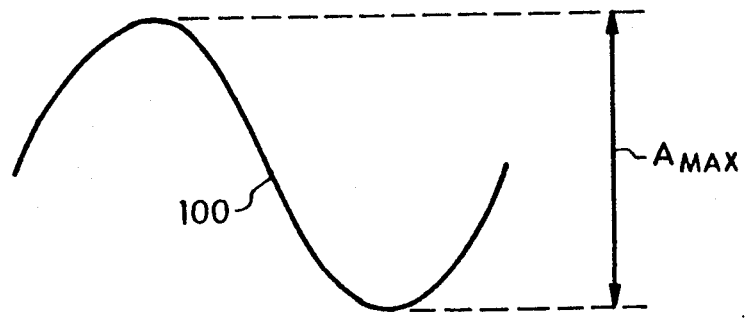
Figure 1C:
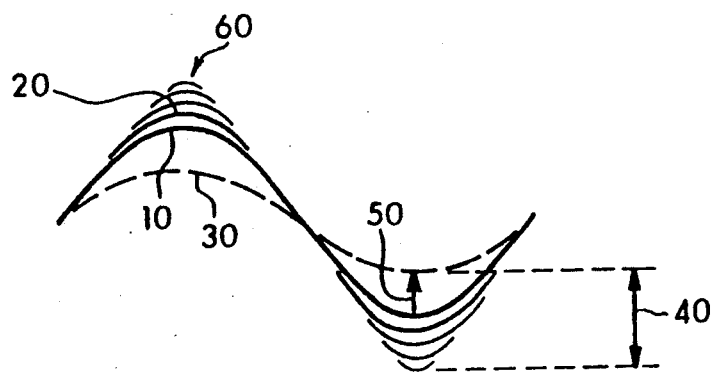
Figure 2:
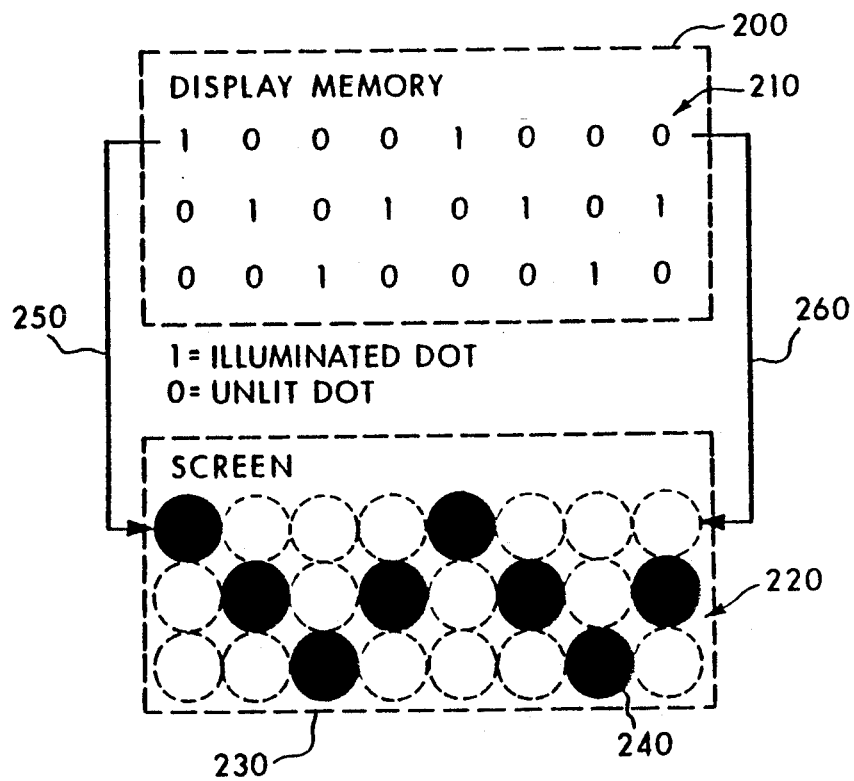
FIG. 2 sets forth prior art digital images as represented in a display memory and as seen on a digital screen.
Figure 4:
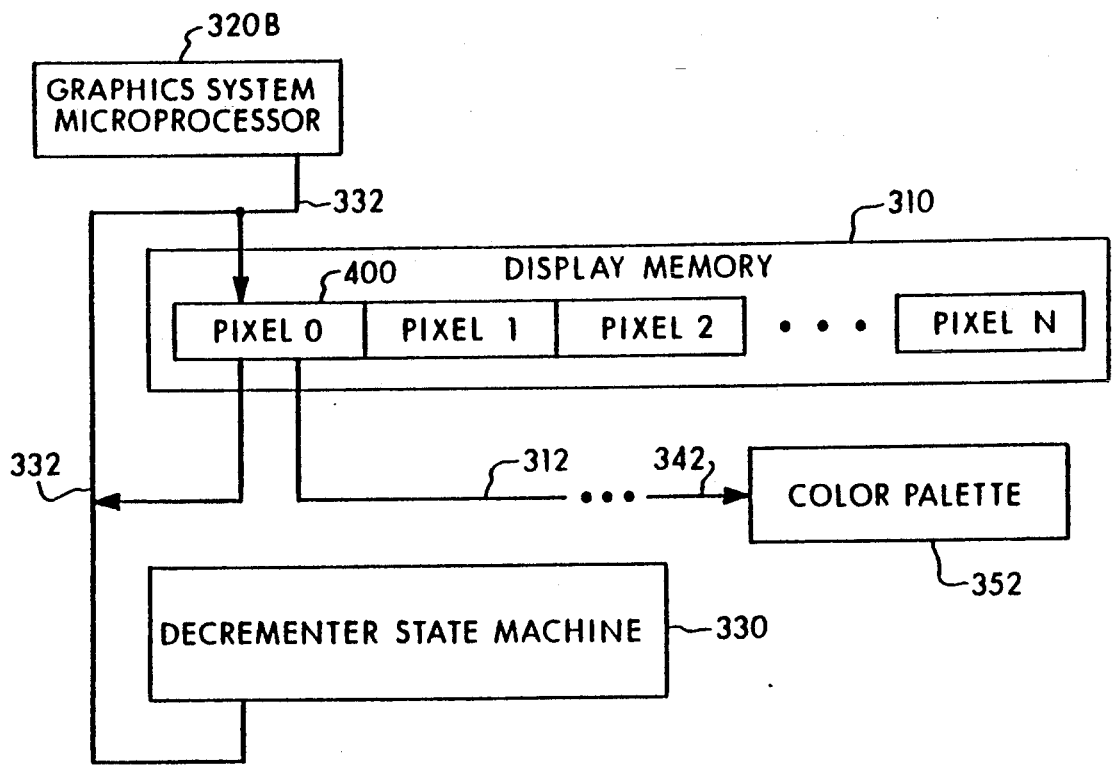
FIG. 4 sets forth the block diagram of the interaction between the decrementer of the present invention and the display memory.

Unlike the conventional display memory 200 of FIG. 2, the display memory 310 for each conventional waveform acquisition channel 372 of the present invention provides a pixel data field 400 for each dot on the display 350. Under the teachings of the present invention, the pixel field 400 is at least two binary bits. Hence, as shown in FIG. 4, a separate pixel field 400 exists for each dot on the display 350. Each pixel field 400 could be greater than two binary bits depending upon the degree of grayness resolution desired. The present invention is not to be limited as to the size of the pixel field as long as it is equal to or greater than two binary bits.

The decrementer state machine 330 reads each pixel field 400 out from the display memory 310 over bus 332 and, if the pixel value is greater than zero, it decrements the pixel value by a given amount such as one. The decremented pixel value is then delivered over bus 332 back into the display memory 310 to replace the read pixel value and the state machine 330 proceeds to the next pixel field 400. Hence, in a sequential fashion, the state machine 330, pixel field by pixel field (i.e., PIXEL 0, PIXEL 1, ..., PIXEL N), decrements each pixel value.

Figure 5:
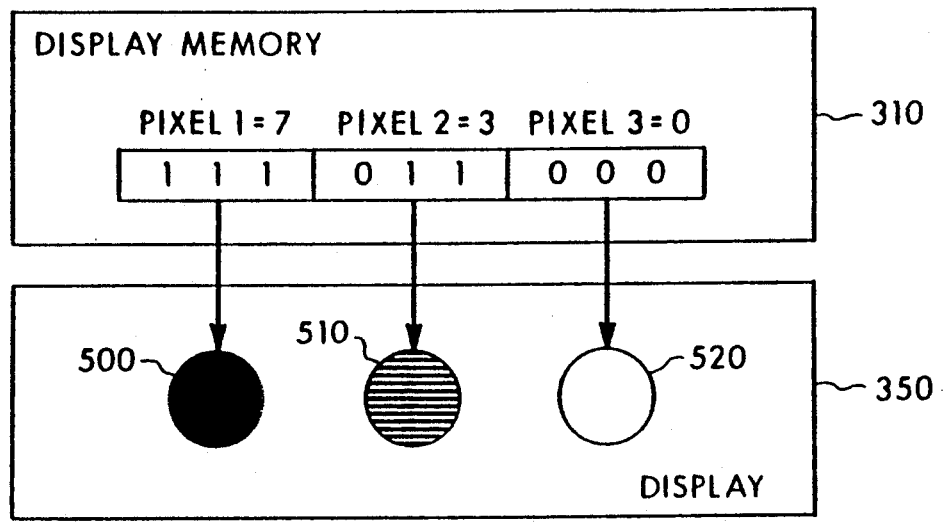
FIG. 5 illustrates the display memory of the present invention using a three bit code to drive the display.

For example, in FIG. 5, the display memory 310 shows three pixels 500, 510, and 520. Each pixel corresponds to a pixel field 400 in the display memory 310. Pixel 1 is fully illuminated having a value of seven (111 binary) stored therein. Pixel 3 is off (i.e., dark) whereas pixel 2, having a value of three (011), is three sevenths brightness. Of course, if four binary digits are utilized, then 15 levels of brightness could be provided. Under the teachings of the present invention, the binary representation of the gray level is delivered over bus 312 to the priority encoding RAM 340. Hence, it can readily be appreciated that gray level information corresponding to the desired level of brightness can now be provided to the display 350. As will be discussed subsequently, a variation on this example will be made to eliminate flicker.

The decrementer state machine 330 is under control of the graphics system microprocessor 320B over the graphics system bus 332. The cycle time of the decrementer 330 can be selectively adjusted by the user through control of input 360 so as to speed up or slow down the period of decrementation (in the preferred embodiment the period ranges vary from a minimum of 50 milliseconds to a maximum of 1.4 seconds). For each period, the decrementer 330 reads each pixel field stored in the display memory 310 and if the value is greater than zero decrements it by a given amount such as one. Hence, the next time that pixel field is read by the display control 320 and displayed 350, the pixel would be drawn on the screen at the desired level of brightness. For example, a pixel whose initial value is seven would be decremented by state machine 330 to six. The next time the display memory 310 is read by the display control 320, the pixel would be redrawn at a gray level value of six. This process then would repeat for the next period.

Figure 7:
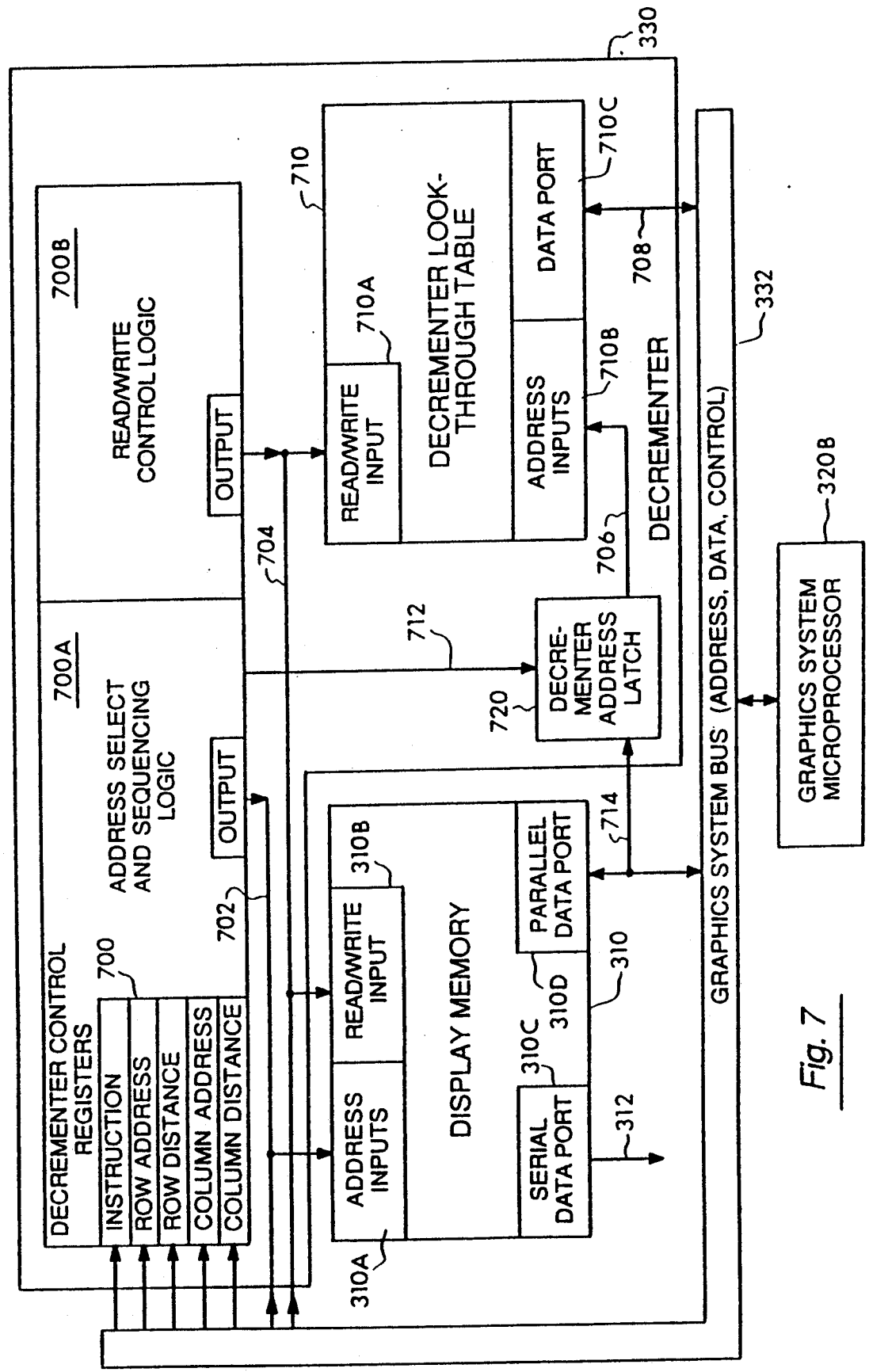
FIG. 7 is the block diagram of the decrementer of the present invention.

In FIG. 7, the details of the decrementer 330 are shown. The decrementer 330 communicates directly with the graphics system bus 332 and is in communication with the graphics system microprocessor 320B. The decrementer 330 also communicates with the display memory 310.

As shown in FIG. 7, the decrementer 330 utilizes a set of decrementer control registers 700. This includes instruction, row address, row distance, column address and column distance registers. These registers are part of the address select and sequencing logic 700A and the read/write control logic 700B. Also included in the decrementer 330 is a decrementer look-through table 710. This is a conventional static RAM. The address select and sequencing logic provides the necessary addresses to the address inputs 310A of the display memory 310 over lines 702. The read/write control logic provides the necessary read/write inputs over line 704 to the read/write inputs 310B of the display memory 310 and to the read/write input 710A of the decrementer look-through table 710. The decrementer look-through table 710 receives address inputs at 710B over lines 706 and delivers data output from data port 710C over lines 708 to the graphics system bus 332. The decrementer address latch 720 is under control of the address select and sequence logic 700A over lines 712 and is interconnected over lines 714 to the graphics system bus 332. The look-through table 710 is initially programmed by delivering data into data port 710C from bus 332.

The display memory 310, as shown in FIG. 7, has address inputs 310A, read/write inputs 310B, a serial data port 310C, and a parallel data port 310D. The serial data port 310C delivers the pixel field 400 to be displayed over lines 312 to the priority encoding RAM 340. Hence, the display memory 310 is a dual port (serial-parallel) arrangement.

The operation of the decrementer 330 as set forth in the system of FIGS. 3 and 7 will be discussed subsequently.

It is to be expressly understood that any number binary bits in the pixel field 400 (as long as it is greater than or equal to two bits) could be used to implement the levels of gray under the teachings of the present invention. It is also to be expressly understood that, although a separate physical decrementer state machine 330 is shown, the graphics system microprocessor 320B could be suitably programmed to implement the decrementation of the pixel fields in the display memory 310.

2. Adjusting Fade Time

The present invention allows the user through manipulation of the user input 360 to specify fade time. The user input 360 delivers the user fade time signal over the host system bus 362 to the host microprocessor 300 to specify the rate of fade. The host microprocessor 300, based upon this input, selectively activates the decrementer state machine 330 to run more or less often. Running the decrementer 330 more often would cause a prior waveform on the screen 350 to fade more quickly from the display and running it less often would cause the dots to fade away more slowly. The user input in the preferred embodiment is a menu selection on screen 350. The user enters persistence time via the instrument's display menu via the front panel knob or keypad. The persistence time (fade time) control can be changed in the same manner as most other controls in the instrument. The user may use the numeric keypad to enter a desired persistence time directly. In this case, the user specified time will be rounded to the nearest supported time (i.e., 179 ms gets rounded to 200 ms). The user may also use the general purpose knob which will change the persistence time in discrete steps. All supported fade time settings are selectable via the knob. Finally, the user may use the increment and decrement keys which work in the same manner as the knob. Pushing the increment key, for example, has the same result as turning the knob clockwise one "click."

3. Processing of Graphical Information

Since modern digitizing oscilloscope displays include text for such things as text, menus and measurement results as well as other graphical information such as graticules and markers, the gray scale features of the present invention are designed so as not to interfere with such graphics information. Such graphics information does not fade with time under the teachings of the present invention.

Figure 6:
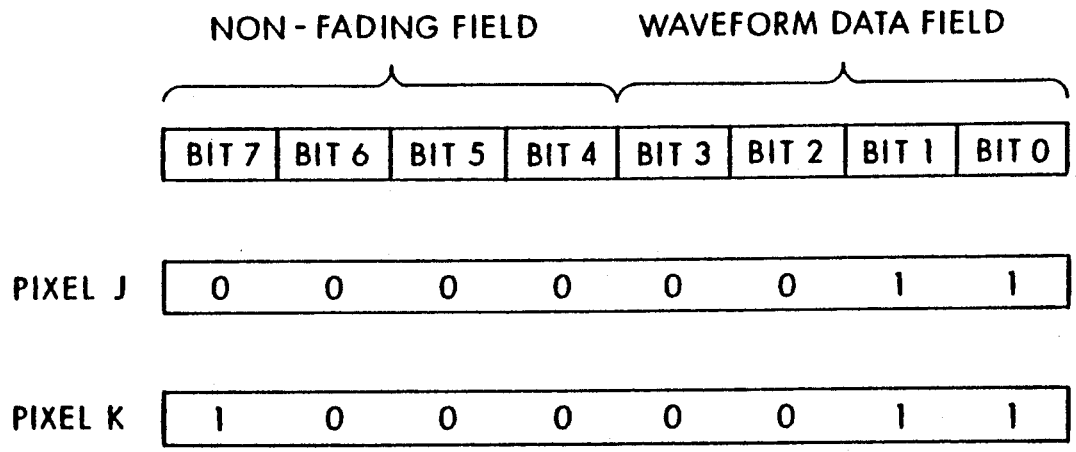
FIG. 6 sets forth the data field layout of the present invention wherein the displayed waveform fades in time, but graphical information does not fade in time.

This is obtained by providing a non-fading field for such graphical information and a fading field for the waveform pixels as shown in the data format of FIG. 6. In FIG. 6, the waveform data field utilizes four binary bits. This field is subject to fading. For example, for pixel J, the lowermost two bits are set to one. This results in pixel J being lit at 3/15 of its maximum brightness. Hence, in the waveform data field of FIG. 6, comprising bits 0 through 3, fifteen levels of brightness can be obtained. The uppermost four bits (bits 4–7) comprise the non-fading field. If one of the upper four bits are set to 1 then the pixel always stays lit at some level of brightness regardless of the value in the waveform data field. Hence, for pixel K shown in FIG. 6, bit 7 is set to a 1 and this results in pixel K being lit at high brightness. In this arrangement, the decrementer 330 reads and modifies each pixel field (bits 0 through 7), but only the lower four bits are decremented (i.e., bits 0 through 3).

Figure 13:
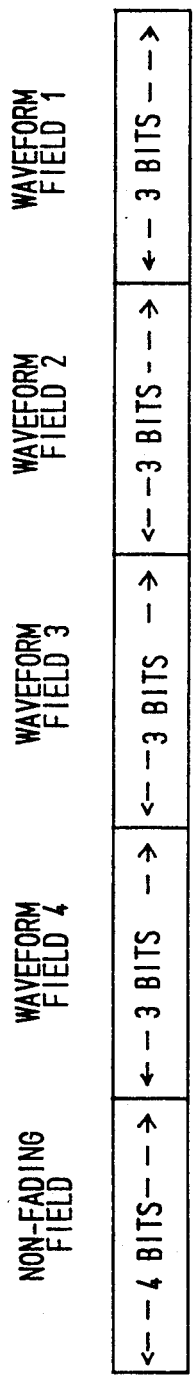
FIG. 13 sets forth a multichannel waveform field for each pixel of the present invention.

The above sets forth the waveform data field for one channel. For a conventional four channel oscilloscope, four waveform fields would be provided, as shown, in FIG. 13. A separate waveform field is dedicated to each channel (i.e., waveform field 1 corresponds to channel CH1). Again, the number of bits in each field can be any suitable number and, in FIG. 13, three bits per field are used. In FIG. 13, the pixel data structure, like FIG. 6, utilizes one 4 bit non-fading field and four 3 bit fading waveform data fields corresponding to channels CH1–CH4. The waveforms acquired from channel 1 are drawn in waveform field 1, from channel 2 are drawn in waveform field 2, etc.

In conclusion, it can be observed that under the teachings of the present invention, the user can use the digitized gray scale information on the display to determine characteristics of the waveform normally observed on analog oscilloscopes such as the range of values taken in the recent past, direction in which the waveform is currently changing, (i.e., values for the most distant sweep are dimmest versus most recent sweeps which are brighter), and the current or most frequent values of the waveform. Furthermore, the user of the present invention can easily see which dots on the screen make up individual waveforms due to the time correlated fade. That is, all dots which make up a given prior waveform trace are at the same brightness whereas older waveform traces are more dim and newer ones are brighter. Finally, the display of the present invention looks more like an analog oscilloscope display. Hence, individuals already trained on analog oscilloscopes can obtain the above mentioned information from the gray scale digitized display of the present invention without any additional training such as learning to interpret dot density, etc. These features will be discussed more fully in the following.

4. Flow of Events During Decrement Cycle

Figure 8:
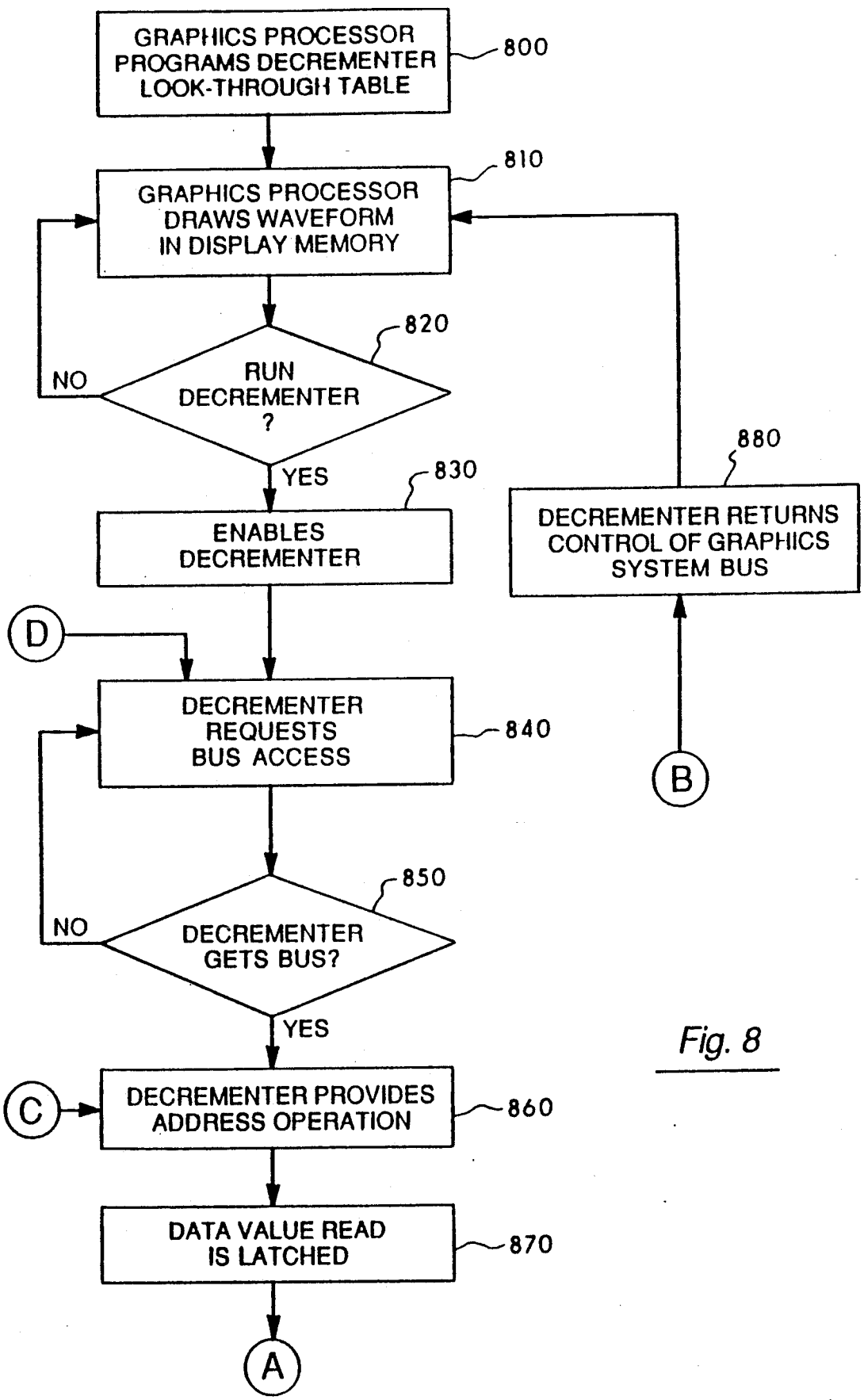
FIGS. 8 and 9 set forth the flow chart of the operation of the decrementer shown in FIG. 7.

In FIG. 8, the method and operation of the decrementer 330 of the present invention will be explained with respect to a decrement cycle.

In stage 800, the graphics system microprocessor 320B programs the decrementer look-through table 710. In this stage the decrementer look-through table is properly programmed upon initialization.

The graphics processor n stage 810 then draws the current waveforms from each of the channels which are turned on in the display memory 310. In stage 820, a decision is made as to whether or not to run the decrementer 330. If the graphics processor decides not to run the decrementer, stage 810 is again entered and the waveforms are displayed. If the decrementer is to be run, the graphics processor programs the decrementer control registers 700 and stage 830 is entered. The graphics processor enables the decrementer 330 to commence decrementation.

Stage 840 is entered and the decrementer 330 requests access to the graphics system bus 332 from the graphics processor 320B. At stage 850, the graphics system microprocessor 320B decides whether or not to grant access to the bus and if granted stage 860 is entered. In stage 860, the decrementer takes control of the graphics system bus 332. The decrementer provides the address of the next display memory location over lines 702 to the address inputs 310A of the display memory 310 and specifies a READ operation over lines 704 for reading the pixel field at that memory location out over bus 714 from the parallel data port 310D.

Then stage 870 is entered. In stage 870, the data value for the pixel field is delivered on line 714 into the decrementer address latch 720. Once latched, the data is delivered over line 706 to the address input 710B of the decrementer look-through table 710.

At this point, as set forth in FIG. 8, the graphics processor has enabled the decrementer 330, and the decrementer 330 has taken control of the graphics system bus 332 so as to have dedicated access to the display memory 310. At point A of FIG. 8, the first display data value for the first pixel field read from the display memory 310 at the first address has been loaded into the decrementer 330.

Figure 9:
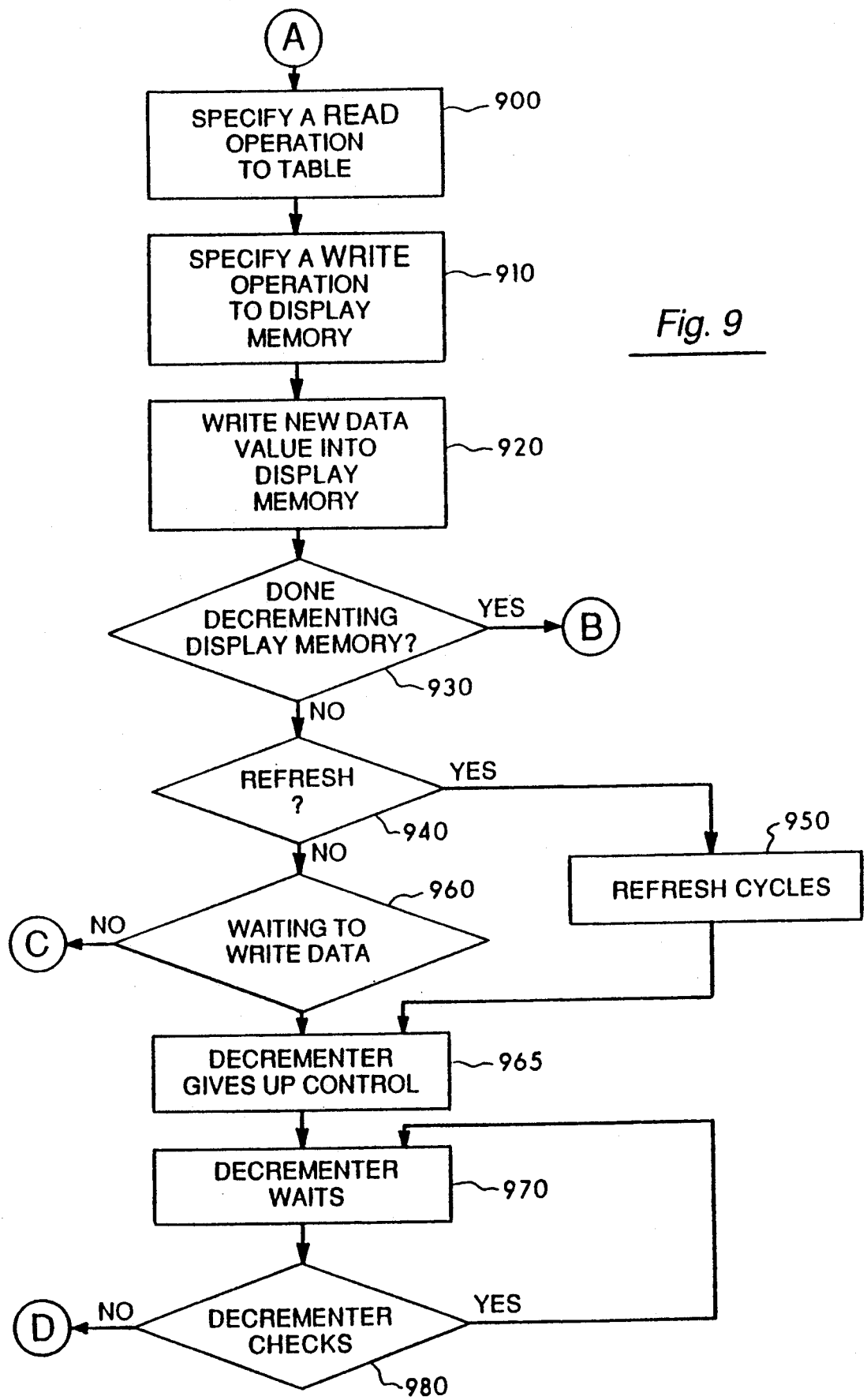

In FIG. 9, the decrementer read/write control logic 700B specifies a READ operation to the decrementer look-through table over bus 704. This occurs in stage 900. The decrementer 330, in stage 910, then specifies a WRITE operation to the display memory over bus 704 to the read/write input 310B. This occurs at the same address specified during the previous read operation in stage 870. In stage 920, the value read from the decrementer look-through table 710 is now delivered through the data output 710C onto the graphics system bus 332 to be written into the display memory 310 through the parallel port 310D to replace the original value in the pixel field. It is to be expressly understood that at this stage in the operation, the data value for the pixel field originally stored in the display memory 310 has been read out and suitably, decremented and the new decremented value has been written back into the display memory 310 at the original location.

Stage 930 is then entered to ascertain whether or not the display memory 310 is fully decremented. If it is, stage 880 of FIG. 8 is entered as shown by B. The decrementer returns control of the graphics system address and data buses 332 to the graphics processor 320B. Stage 810 is then entered. If the display memory is not fully decremented in stage 930, stage 940 is entered. The decrementer checks to see if the display controller 320A has signalled over bus 324 that it needs to do a display refresh cycle or if, according to the decrementer's own internal timer, it is time for display controller 320A to do some memory refresh cycles.

If either type of refresh cycle is needed, stage 950 is entered. In stage 950, memory refresh cycles are done whether they are actually needed or not. Stage 965 is then entered.

In Stage 940, if there is not a need to refresh, stage 960 is entered. Again, the decrementer 330 ascertains whether or not the host 300 is waiting to write data into the display system. If it is not, "C" is entered and stage 860 is once again entered to decrement the next data value in the display memory 310. This process continues until all of the data in the display memory 310 is appropriately decremented.

In stage 960, if the host is waiting to write data into the display memory 310, then stage 965 is entered and the decrementer 330 gives up control of the graphics system bus 332 to the graphics system microprocessor 320B. Stage 970 is then entered wherein the decrementer 330 waits for several clock cycles before requesting the bus 332 to finish the decrement cycle. This allows time for one or more of the following to occur: memory refresh cycles, display refresh cycles, and the host microprocessor 300 passing data to the display memory 310. Stage 980 is then entered and the decrementer checks to see if the host 300 is still waiting to write data into the display memory 310. If not, stage 840 is entered wherein the decrementer requests the bus 332 in order to complete decrementing of the display memory 310. If the host 300 is still waiting, stage 970 is re-entered.

The above fully describes the operation of the decrementer 330 pertaining to the flow of events occurring during the decrement cycle. It is to be expressly understood that a number of different approaches to programming the system of the present invention could be utilized to accomplish the same goals as achieved by the operation set forth in FIGS. 8 and 9.

5. Host processor 300 Operation During Acquisition and Display Cycle

Figure 10:
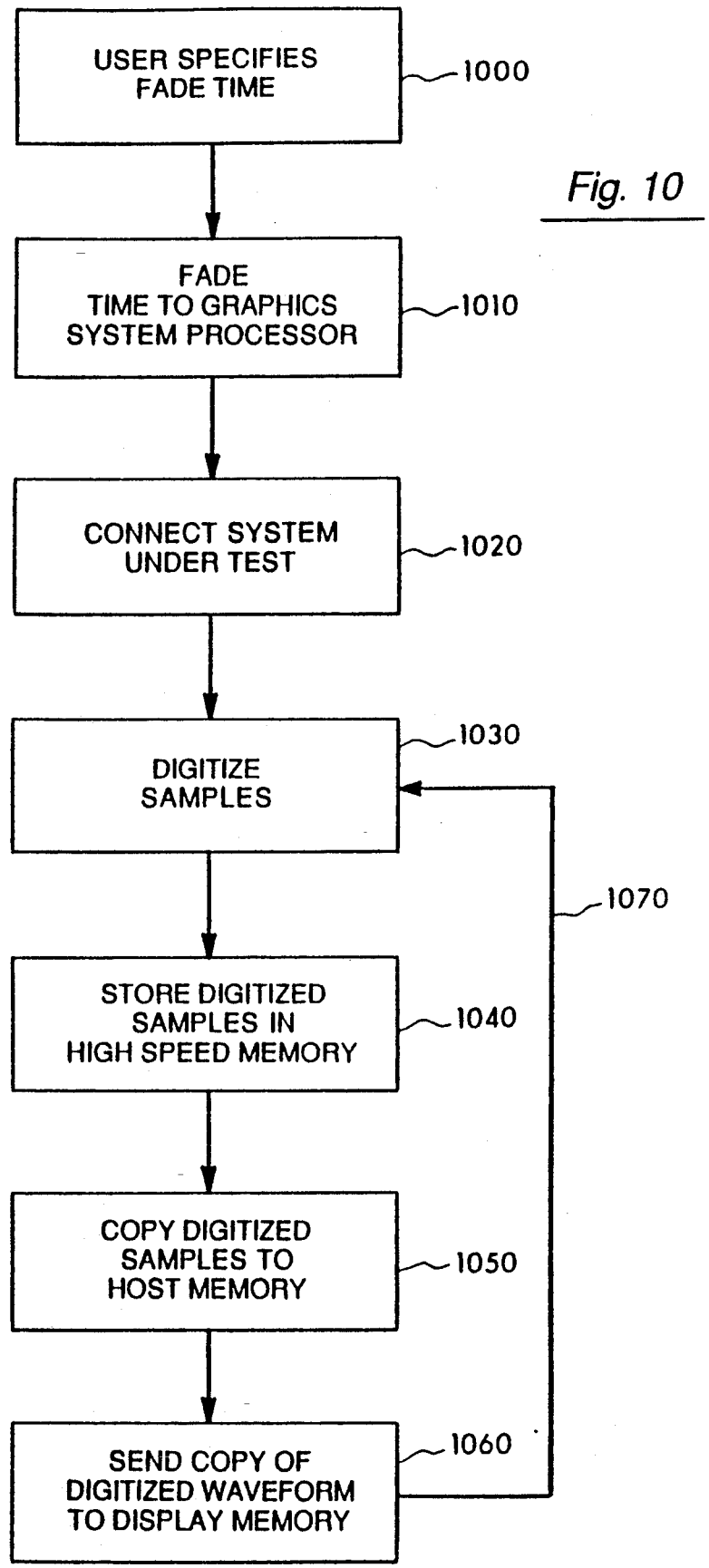
FIG. 10 sets forth the operation of the host processor of the present invention.

In FIG. 10, the operation of the host processor 300 is set forth. In stage 1000, the user of the present invention adjusts the user input 360 to select a time duration for the waveform on display 350 to fade from full brightness to black. The user sets the "fade time." This is received by the host processor 300 over the host system bus 362. The host processor 300 then delivers the specified fade time to the graphics system microprocessor 320B. This occurs in stage 1010. The user can select a fade time varying, in the preferred embodiment, between 100 milliseconds and 10 seconds.

The user of the present invention in stage 1020 interconnects the system under test 370 to the sampling circuit 380 and trigger circuit 303. In stage 1030, the A/D converter digitizes samples of signals obtained from the system under test 370. These digitized samples are then passed from the A/D converter 384 over line 386 into the high speed memory 390 as set forth in stage 1040.

The host processor 300 copies the digitized samples representing the waveform for each channel from the high speed memory 390 into the normal host memory 364 as set forth in stage 1050. The host microprocessor then sends copies of the digitized waveform from the host memory 364 over host system bus 362 to the display memory 310 as set forth in stage 1060. As indicated in FIG. 10, this process continues as shown by loop 1070 to continually obtain samples of the waveform from the system under test 370.

It is to be expressly understood that this approach is conventional in the art and is set forth above for completeness of the disclosure for the present invention.

6. Operation of Graphics System 320 During Waveform Display and Gray scale Simulation In FIG. 11, the general method and operation of the graphics system 320 during waveform display and gray scale simulation is set forth. In stage 1100 the graphics system microprocessor (GSP) 320B programs the decrementer look-through table 710 of FIG. 7. The following sets forth an example of how the processor 320B programs the decrementer look-through table. For example, assume that a four bit field is used for each pixel to be displayed on the screen 350. The lower most three bits correspond to the fading waveform field and the higher fourth bit corresponds to the bit field which is used for the display graticule and which is not subject to fading. This example is different from the example of FIG. 6 and is being used to represent a simplistic explanation of what occurs in stage 1100. It is to be expressly understood that the present invention is not limited to the number of bits in the pixel field which fades or to the number of bits which are utilized for the graphics information which does not fade.

Table 1 sets forth the contents of the decrement look-through table in this example:

TABLE I

| Contents of Decrementer Look-Through Table | |
|---|---|
| RAM ADDRESS | RAM CONTENTS |
| 0000 | 0000 |
| 0001 | 0000 |
| 0010 | 0001 |
| 0011 | 0010 |
| 0100 | 0011 |
| 0101 | 0100 |
| 0110 | 0101 |
| 0111 | 0110 |
| 1000 | 1000 |
| 1001 | 1000 |
| 1010 | 1001 |
| 1011 | 1010 |
| 1100 | 1011 |
| 1101 | 1100 |
| 1110 | 1101 |
| 1111 | 1110 |

In Table I each RAM 710 address addresses a specific location in the look-through table. In the above it is to be noted that the first eight addresses are not addressed to graphics information such as graticules but rather are addressed to a waveform data value which will fade under the teachings of the present invention. That is, the first eight addresses have the fourth bit set to zero. The first address of "0000" addresses "0000." The second address of "0001" also addresses "0000" indicating a decrement of one. The third pixel value of "0010" outputs "0001" causing a fade of one increment to occur. This linear fade occurs for the remaining five values. It is to be expressly understood that under the teachings of the present invention, any set of values could be utilized in the RAM 710 contents. For example, the decrementation could be by two rather than one or the first four values could be decremented by one and the second four could be decremented by two. Or, it may be desirable to decrement the first two by one, the next two by two, the third two by three, etc. The look-through table may be programmed in any suitable fashion. The remaining eight values in Table I pertain to graphical information having the fourth bit set to one. Again, the addresses follow the sequence set forth above.

Stage 1110 is now entered. In this stage the graphics system microprocessor 320B programs the priority encoding RAM 340 as shown in FIG. 3. This programming occurs over bus 332. The purpose of the priority encoding RAM 340 is to arbitrate when items of different colors overlap on the display 350 to include the same pixel. The priority encoding RAM, as set forth in Table II below, gives waveform data a higher priority than the graphical information. Therefore, if a graticule and a waveform both pass through the same pixel on the display 350, the pixel will be illuminated in the waveform color. The simplistic example set forth above for Table I is continued in Table II and it is to be expressly understood that the present invention is not to be limited by this example.

TABLE II

| Priority Encoding RAM | |
|---|---|
| RAM ADDRESS | RAM CONTENTS |
| 0000 | 0000 |
| 0001 | 0001 |
| 0010 | 0010 |
| 0011 | 0011 |
| 0100 | 0100 |
| 0101 | 0101 |
| 0110 | 0110 |
| 0111 | 0111 |
| 1000 | 1000 |
| 1001 | 0001 |
| 1010 | 0010 |
| 1011 | 0011 |
| 1100 | 0100 |
| 1101 | 0101 |
| 1110 | 0110 |
| 1111 | 0111 |

In Table II, it is clear that when graphical information is present (i.e., indicated by the fourth bit of the RAM address being "1") then the output of the priority encoding RAM contents will clearly produce the waveform information and not the graphical information. This assigns viewing priority to the waveforms on the screen. The only time the graphical information is displayed is when the address if "1000" (i.e., the waveform does not coincide with the graphical information) and then the output of the priority encoding RAM contents is "1000." At all other times, the waveform information is displayed giving priority over the graphical information for that particular pixel. It is to be expressly understood that if it is desired, the graphical information can have priority over the waveform. In this case, the last eight entries for the RAM contents would be "1000."

In stage 1120, the graphics system processor 320B programs the color look-up table 352A of FIG. 3 over bus 332. Again, the example of Tables I and II will be utilized o explain the operation of the color look-up table 352A. This is set forth in Table III below:

TABLE III

| Color Look-Up Table Contents | | |
|---|---|---|
| Waveform | Look-Up Table Address | Color Specification Sent to Video DACs |
| T-7 | 0000 | Background Color |
| T-6 | 0001 | 1/6 Intensity |
| T-5 | 0010 | 2/6 Intensity |
| T-4 | 0011 | 3/6 Intensity |
| T-3 | 0100 | 4/6 Intensity |
| T-2 | 0101 | 5/6 Intensity |
| T-1 | 0110 | Full Intensity |
| T | 0111 | Full Intensity |
|  | 1000 | Color-Gray |

In Table III, the look-up table address which is delivered from the priority encoding RAM 340 is again a four bit binary address. This format is used in this example and is not to limit the teachings of the present invention. In the example, each binary address corresponds to a particular color specification which is sent to the video DACs 352B. The binary "0000" corresponds to the background color —i.e., the pixel is unlit. The binary value "1000" corresponds to the graticule color which in the preferred embodiment is gray and is used for graphical information. The remaining binary values correspond to a particular value of intensity.

In the example shown in Table III, the binary values corresponding to "0001" through "0101" correspond to a gray scale analog range of 1/6 through 5/6 of the intensity of the waveform color. Binary values "0110" and "0111" correspond to the full analog intensity of the waveform color.

This is an important aspect of the present invention since these binary values produce the full intensity of the waveform color. Hence, as the waveform is displayed during the first cycle of decrementation, even through the pixel data field is decremented by the decrementer 330, the full intensity of the waveform color is maintained by the color look-up table 352A. It is only during the next cycle of decrementation that the pixel goes to 5/6 of the full intensity of the waveform color. This minimizes flicker from occurring under the teachings of the present invention. In other words, during the first period of decrementation, the pixel is maintained at full intensity in order to substantially prevent an annoying flicker which would otherwise occur. Flicker occurs as a result of all full intensity waveform pixels being faded to less than full intensity followed by a new waveform being drawn in illuminated full intensity. By drawing pixels with decimal values of 7 and 6 at full intensity, flicker is minimized (that is, the current and the first prior waveform both are at full brightness). This tends to maintain a constant level of brightness across the display with no perceptible flicker to the human user.

The present invention, however, is not limited to the first prior waveform (T-1) being illuminated at full brightness and the first prior waveform could be decremented to less than full brightness. Indeed, it is to be expressly understood that any suitable set of values can be programmed into the color look-up table 352A. For example, three addresses (0111, 0110, and 0101) could be programmed to be full intensity to maintain full brightness for the current and the two most recent prior waveforms.

In Table III, the current and first prior waveforms are illuminated at full brightness. Each of the next prior waveforms are illuminated at an intensity of brightness depending upon the age of the prior waveform. The dimmest illumination corresponds to the oldest waveform and the oldest waveform is uniformly the same level of brightness. In Table III, the first prior waveform (T-1) is illuminated at full brightness, the second (T-2) is illuminated at 5/6 intensity and the remaining waveforms (T-2, etc.) fade uniformly. Table III sets forth a specific dependency between age of waveform and intensity of illumination. This dependency is a matter of design choice. For example, the first prior waveform (T-1) could be illuminated at 6/7 intensity with the remaining waveforms (T-2, etc.) uniformly fading therefrom.

Figure 11:
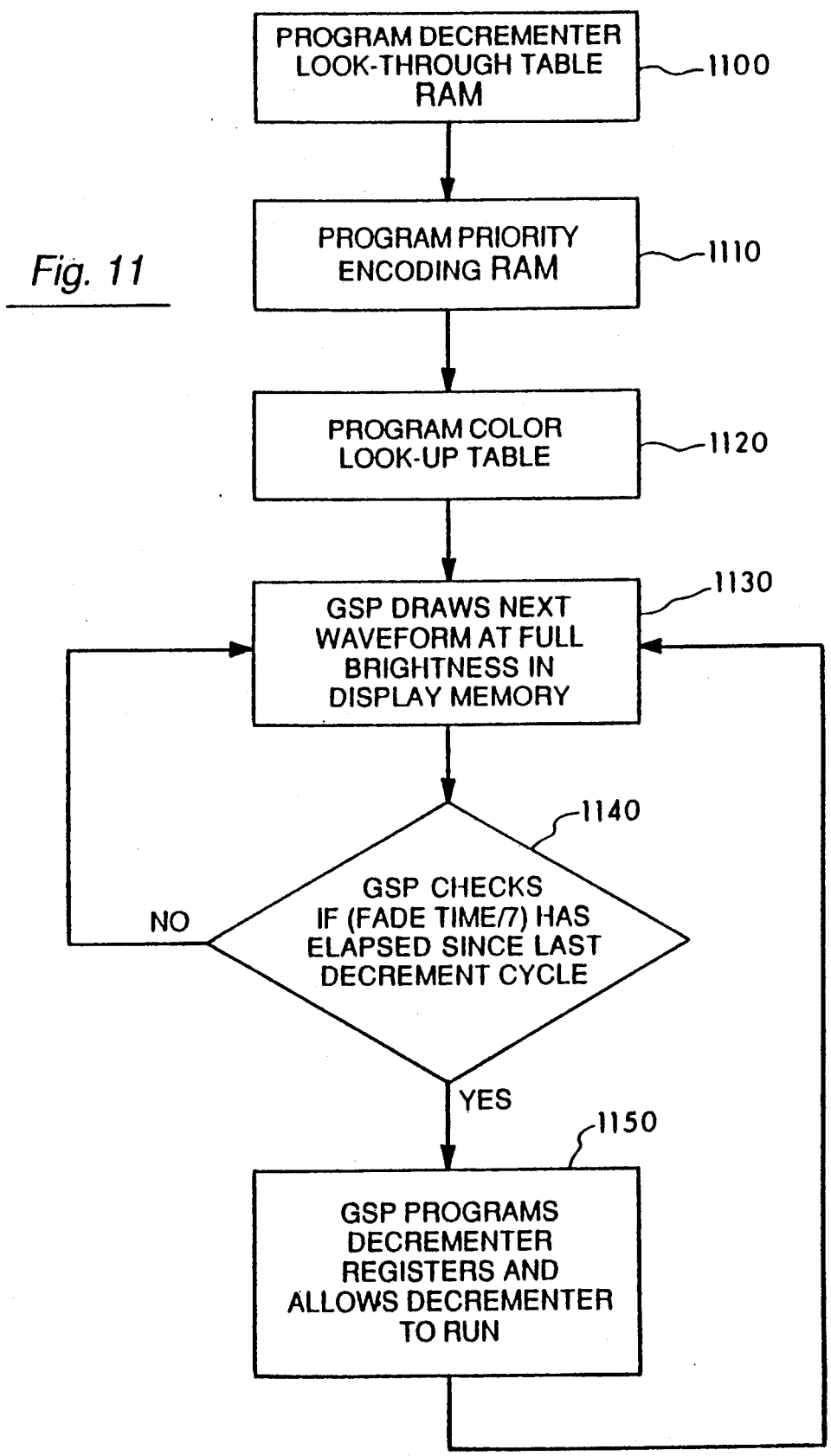
FIG. 11 sets forth the operation of the graphics system processor of the present invention.

Stage 1130 of FIG. 11 is now entered. The GSP 320B draws the next waveform at full brightness. Stage 1140 is entered and the graphics system processor 320B determines whether the user specified fade time (÷ seven) has elapsed. If not, stage 1130 is reentered. If so, stage 1150 is entered to allow the decrementer to operate.

Figure 12:
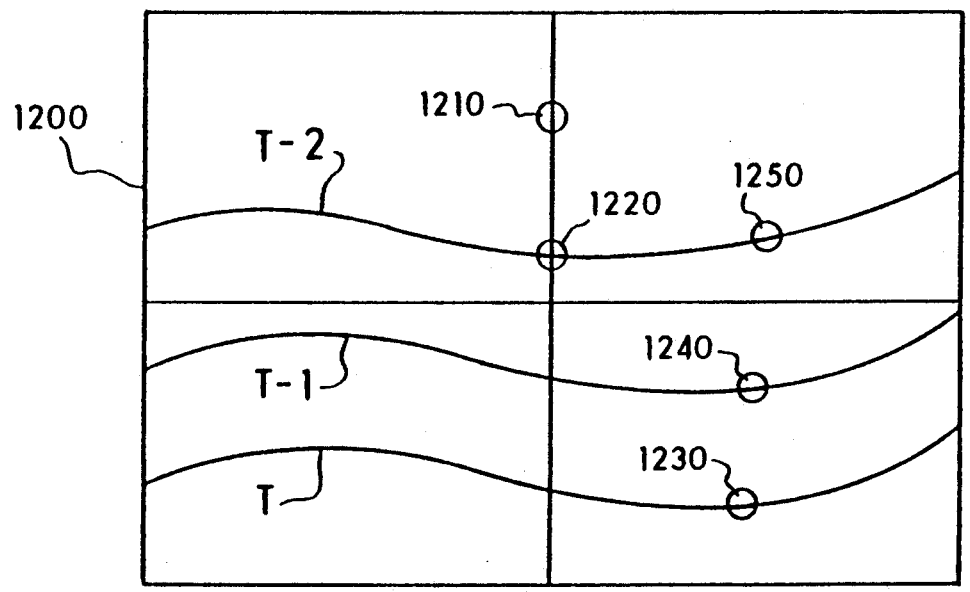
FIG. 12 illustrates a display of the present invention.

In FIG. 12, a display 1200 appearing on screen 350 is shown based upon the examples of Tables I, II and III. In FIG. 12, waveform T is the most recently drawn waveform, waveform T-1 is the waveform drawn in time just prior to waveform T and waveform T-2 represents a waveform drawn in time just prior to waveform T-1. In the example of FIG. 12, it is assumed that the time required to draw the waveform is approximately equal to 1/7 of the user's specified waveform fade time. Hence, the decrementer 330 runs immediately after each waveform is drawn. Pixel 1210 corresponds to graphical information such as a graticule and has a code of "1000." Pixel 1220 is at the intersection of a graticule and waveform T-2 and based upon the above discussion, waveform T-2 has priority and pixel 1220 has a code of "0101." The most recent drawn waveform T is composed of pixels corresponding to pixel 1230 which has a code of "0111." Waveform T-1 is composed of pixels 1240 and has a code of "0110." Keep in mind that waveform T and T-1 have the same intensity as set forth in Table III above. Waveform T-2, however, corresponding to pixel 1250 has an intensity of "0101" which as set forth in Table III above is 5/6 the intensity of the waveform color. The user has the option to adjust the fade time to decrement after the first waveform, after the first two waveforms, etc.

The format in FIG. 13 provides a number of benefits over using a single fading waveform data field as shown in FIG. 6. First, the user of a multiple channel oscilloscope would like the ability to turn the displays of channels on and off independently without losing gray scale information. When only a single waveform data field is used, as shown in FIG. 6, data from all channels must be drawn into that single fading field. Once the data is drawn in that single field, there is no way in the system to know from which channel the data originated. The present invention as shown in FIG. 16, however, solves this problem. It does not cause the permanent loss of waveform data. Since the waveform data from each channel has its own dedicated waveform data field, the waveform data from channel 1 could be erased by clearing the waveform field without affecting the other waveform fields. Hence, the waveforms from each channel are preserved and do not need to be redrawn.

An additional benefit is obtained by the approach of FIG. 13 when used in conjunction with a color display. Clearly, if the multiple fields of FIG. 13 are used with a monochrome display, then all waveforms must be, by definition, drawn in shades of the same base color such as blue, green, gray or amber. However, the use of multiple waveform data fields in conjunction with a color display and a color look-up table, allows waveforms for each channel (each waveform field) to be drawn in a different base color. Each waveform field is assigned a different color. For example, a channel 1 waveform may be illuminated in a base color of yellow. Waveforms in channel 1 would initially be illuminated in full brightness yellow and would then fade through successively dimmer shades of yellow as the waveforms aged. Likewise, channel 2 waveforms could have a base color of green, channel 3 waveforms could have a base color of purple, etc. The actual color scheme used could vary and in the above Hewlett Packard 54720A conventionally available oscilloscope, the users are free to specify whatever colors they prefer. By using multiple waveform fields in the pixel data structure shown in FIG. 13, the user gains all of the previously mentioned benefits of digitally synthesized gray scale, plus the ability to determine the channel from which the individual waveforms are acquired.

The use of multiple fields as shown in FIG. 13 provides another benefit through use of a color display when waveforms overlap. The overlapped pixels can be of a separate color than either of the two or more overlapping waveforms. The priority encoding RAM 340 of FIG. 3 is fully explained above. The overlapped colors are determined by programming of the priority encoding RAM 340 and the color look-up table 352. For example, data in waveform field 1 (corresponding to channel CH1) of FIG. 13 could be programmed to have priority over all other data. Likewise, data in waveform field 2 (corresponding to channel CH2) could be programmed to have priority over all data except data from field 1. In this mode of operation, the overlapped color is the color of the priority field. For example, if waveform from channel CH1 overlaps with waveform from channel CH2, the overlapped color is that of channel 1.

Alternately, the overlapped color could be displayed as an appropriate combination of the colors which overlap. The present invention recognizes that it is conventional to provide a unique and single overlap color where two or more colored waveforms overlap on the display of an oscilloscope.

For example, in the Hewlett Packard 5411X family of color oscilloscopes, display locations at which two or more waveforms overlap are illuminated in a unique overlap color which defaults to bright pink, regardless of the underlying waveform colors. However, the present invention provides overlap colors which more accurately reflect the colors of the waveforms which are overlapping and which, under the teachings of the present invention, enable fading of the overlap color to occur.

Figure 14:
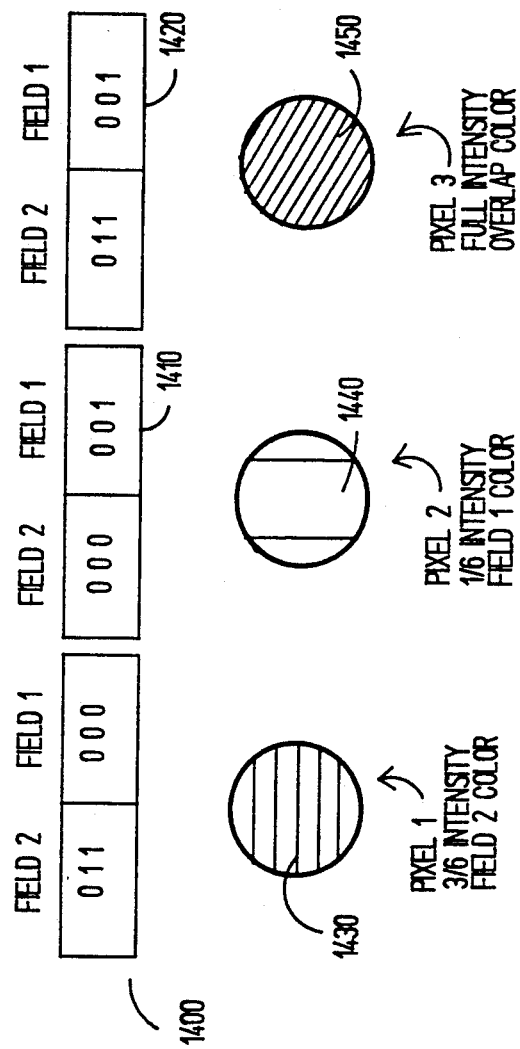
FIG. 14 sets forth a first example wherein the overlapping pixel is of uniform brilliance.

The overlap features of the present invention are discussed next. In the following two examples, assume that FIG. 13 (corresponding to a single pixel) has waveform data fields corresponding the CH1 and CH2 (i.e., fields 1 and 2) with data contained therein. In other words, the waveforms overlap on this pixel. Furthermore, the graphics field does not have any data. Hence, the pixel will correspond to an overlap pixel. Furthermore, the waveform field values correspond to those set forth in Table III. In FIG. 14 representing the first example, pixel 1 corresponds to the color and age representing the waveform in field 2 which is at 3/6 intensity. Obviously, the data field portion 1400 shows no data in field 1 and only data in field 2. Likewise, pixel 2 corresponds to the color and age of the waveform in field 1 which is at 1/6 intensity. Likewise, the data field 1410 only contains information for field 1. When these two waveforms overlap at pixel 3, the data fields 1420 have data corresponding to the channel 1 and channel 2 waveforms. When this occurs, look-up table 352a outputs a full intensity overlap color for pixel 3. Hence, in the first example, the overlapped color, represented by pixel 3, is always drawn at full intensity regardless of the ages of the waveforms which overlap. Pixel 1 has a color 1430 such as blue, pixel 2 has a separate color 1440 such as yellow and pixel 3 could have a full intensity overlapped color 1450 such as pink.

It is clear under the teachings of the present invention that if two or more waveforms overlap, as illustrated in FIG. 14, the color look-up table 354a can output any desired overlap full intensity color. This is true regardless of the age of the overlapping waveforms.

The second example is illustrated in FIG. 15. In FIG. 15, the same waveforms of FIG. 14 have the same age overlap. In this example, the overlapped color (i.e., pixel 3) is drawn at the intensity of the newest waveform (i.e., in the example of FIG. 15 that is the channel 2 field form). Hence the color 1500 which could correspond to any color, such as pink, is drawn at 3/6 intensity corresponding to the intensity value of the newest waveform. In other words, the overlapped color intensity will be determined by the waveform field with the largest binary count value.

The priority encoding RAM 340 performs the same function with the multiple fading waveform fields of FIG. 13 as it did with the single fading form field of FIG. 6. It determines whether the waveform data or static graphics takes priority at locations where they overlap. Under the teachings of the present invention, the overlapped color is only used where waveform data overlaps and it is not used where waveforms and static graphic objects overlap or where static graphic objects overlap each other. In these two cases, the priority in coding RAM 340 assigns priority to the overlapping items such that one will appear to be drawn on top of the other.

The color look-up table 352a is programmed to actually assign the colors. The algorithm used to program this table determines what color will be displayed where waveforms overlap.

In the following tables, the following assumption is made. In the following example, assume the graphics field is 1 bit and there are two channels, channel 1 (field 1) and channel 2 (field 2). Each of the waveform fields in this example have only two bits of data. In Table IV which follows, all possible combinations of data values for the static graphics, waveform 1 and waveform 2 are presented.

TABLE IV

| RAM ADDRESS | RAM CONTENTS | COMMENTS |
|---|---|---|
| 0 00 00 | 0 00 00 | No waveform or static graphics |
| 0 00 01 | 0 00 01 | Waveform 1 |
| 0 00 10 | 0 00 10 | |
| 0 00 11 | 0 00 11 | |
| 0 01 00 | 0 01 00 | Waveform 2 |
| 0 01 01 | 0 01 01 | Waveforms overlap |
| 0 01 10 | 0 01 10 | |
| 0 01 11 | 0 01 11 | |
| 0 10 00 | 0 10 00 | |
| 0 10 01 | 0 10 01 | |
| 0 10 10 | 0 10 10 | |
| 0 10 11 | 0 10 11 | |
| 0 11 00 | 0 11 00 | |
| 0 11 01 | 0 11 01 | |
| 0 11 10 | 0 11 10 | |
| 0 11 11 | 0 11 11 | |
| 1 00 00 | 1 00 00 | Static graphics only |
| 1 00 01 | 0 00 01 | Waveform 1 takes priority |
| 1 00 10 | 0 00 10 | |
| 1 00 11 | 0 00 11 | |
| 1 01 00 | 0 01 00 | Waveform 2 takes priority |
| 1 01 01 | 0 01 01 | Waveforms overlap, take priority |
| 1 01 10 | 0 01 10 | |
| 1 01 11 | 0 01 11 | |
| 1 10 00 | 0 10 00 | |
| 1 10 01 | 0 10 01 | |
| 1 10 10 | 0 10 10 | |
| 1 10 11 | 0 10 11 | |
| 1 11 00 | 0 11 00 | |
| 1 11 01 | 0 11 01 | |
| 1 11 10 | 0 11 10 | |

TABLE IV-continued

| RAM ADDRESS | RAM CONTENTS | COMMENTS |
|---|---|---|
| 1 11 11 | 0 11 11 | |

In this and the following tables, the data format used for the RAM Address and RAM Contents is: Graticule Field (1 bit), Field 2 (2 bits), and Field 1 (2 bits). For the RAM address of "0 00 01", the RAM contents is simply the data value for waveform 1 or "01" in field 1. When the RAM address is "0 01 00", the output is the binary value for the waveform 2 in field 2 or "01". However, when the waveforms overlap, for example at "00 01 01", the output is "0 01 01" for the three fields. It can be appreciated that the RAM contents in the above example corresponds to the RAM address and that any suitable programming for the RAM contents could occur. What is clearly evident is that overlap is fully handled even though the waveforms fade.

In the following example, which is based upon the data configuration of Table IV, it is assumed that the overlapped color is always drawn at the same intensity as shown in FIG. 14. It is also assumed (since the example uses 2 bit waveform fields) that waveform field values of "11" and "10" are drawn at full intensity. Hence, waveform field value "01" is drawn at half intensity. It is to be appreciated that this is a simplistic case and that the teachings set forth in the following apply to any bit waveform field. Based upon these assumptions, the following "Look-up Table Address" is sent to the Video DACS 352b of FIG. 3.

TABLE V

| LOOK-UP TABLE ADDRESS | COLOR SPECIFICATION SENT TO VIDEO DACs |
|---|---|
| 0 00 00 | Background color |
| 0 00 01 | ½ intensity, field 1 color |
| 0 00 10 | Full intensity, field 1 color |
| 0 00 11 | Full intensity, field 1 color |
| 0 01 00 | ½ intensity, field 2 color |
| 0 01 01 | Overlap color |
| 0 01 10 | Overlap color |
| 0 01 11 | Overlap color |
| 0 01 11 | Overlap color |
| 0 10 00 | Full intensity, field 2 color |
| 0 10 01 | Overlap color |
| 0 10 10 | Overlap color |
| 0 10 11 | Overlap color |
| 0 11 00 | Full intensity, field 2 color |
| 0 11 01 | Overlap color |
| 0 11 10 | Overlap color |
| 0 11 11 | Overlap color |
| 1 00 00 | Color gray (Static graphics color) |

Notice when fields 1 and 2 overlap (address "0 01 01") the overlap color is displayed with full intensity. It becomes apparent that based upon the programming set forth in the look-up table 352a that the desired overlap color can be effectuated.

In the following example, which is also based upon the waveform field values of Table IV and the assumptions set forth in the above example except that the waveform overlap color intensity is determined by the intensity level of the waveforms which overlap. In other words, the overlap color intensity is equal to the highest intensity of the overlapping waveforms (i.e., the newest waveform).

TABLE VI

| LOOK-UP TABLE ADDRESS | COLOR SPECIFICATION SENT TO VIDEO DACS |
|---|---|
| 0 00 00 | Background Color |
| 0 00 01 | ½ intensity, field 1 color |
| 0 00 10 | Full intensity, field 1 color |
| 0 00 11 | Full intensity, field 1 color |
| 0 01 00 | ½ intensity, field 2 color |
| 0 01 01 | ½ intensity, overlap color |
| 0 01 10 | Full intensity, overlap color |
| 0 01 11 | Full intensity, overlap color |
| 0 10 00 | Full intensity, field 2 color |
| 0 10 01 | Full intensity, overlap color |
| 0 10 10 | Full intensity, overlap color |
| 0 10 11 | Full intensity, overlap color |
| 0 11 00 | Full intensity, field 2 color |
| 0 11 01 | Full intensity, overlap color |
| 0 11 10 | Full intensity, overlap color |
| 0 11 11 | Full intensity, overlap color |
| 1 00 00 | Color gray (Static graphics color) |

The above illustrates the fading of the overlap color to the highest intensity waveform. Clearly with respect to FIG. 15 wherein each field is 3 binary bits, the effect becomes more pronounced than that set forth above. However, Table VI does illustrate an important feature of the present invention wherein the overlapped color uses an overlap intensity corresponding to the newest waveform. It is to be expressly understood that the overlap brightness could also correspond to the intensity of the oldest waveform or, for that matter, any desired intensity level. It is simply a matter of programming the look-up table.

The decrementer look-through table 710 of FIG. 7 is programmed to decrement all waveform fields in the pixel structure simultaneously. It is irrelevant to the decrementer whether or not waveforms overlap. This is illustrated in the following example. Table VII uses the same assumptions and field structure as the prior two examples. As before, the decrementer decrements each of the waveform fields by "01".

TABLE VII

| RAM ADDRESS | RAM CONTENTS |
|---|---|
| 0 00 00 | 0 00 00 |
| 0 00 01 | 0 00 00 |
| 0 00 10 | 0 00 01 |
| 0 00 11 | 0 00 10 |
| 0 01 00 | 0 00 00 |
| 0 01 01 | 0 00 00 |
| 0 01 10 | 0 00 01 |
| 0 01 11 | 0 00 10 |
| 0 10 00 | 0 01 00 |
| 0 10 01 | 0 01 00 |
| 0 10 10 | 0 01 01 |
| 0 10 11 | 0 00 10 |
| 0 11 00 | 0 10 00 |
| 0 11 01 | 0 10 00 |
| 0 11 10 | 0 10 01 |
| 0 11 11 | 0 10 10 |
| 1 00 00 | 1 00 00 |
| 1 00 01 | 1 00 00 |
| 1 00 10 | 1 00 01 |
| 1 00 11 | 1 00 10 |
| 1 01 00 | 1 00 00 |
| 1 01 01 | 1 00 00 |
| 1 01 10 | 1 00 01 |
| 1 01 11 | 1 00 10 |
| 1 10 00 | 1 01 00 |
| 1 10 01 | 1 01 00 |
| 1 10 10 | 1 01 01 |
| 1 10 11 | 1 01 10 |
| 1 11 00 | 1 10 00 |
| 1 11 01 | 1 10 00 |
| 1 11 10 | 1 10 01 |

TABLE VII-continued

| RAM ADDRESS | RAM CONTENTS |
|---|---|
| 1 11 11 | 1 10 10 |

It is to be expressly understood that the claimed invention is not to be limited to the description of the preferred embodiment but encompasses other modifications and alterations within the scope and spirit of the invention concept. For example, while the preferred embodiment of the present invention is based upon an oscilloscope, the teachings of the present invention are useful for any raster scan display. In such applications, images rather than waveforms are drawn on the display 350 with the current and first prior image being drawn at full brightness and the earlier prior images being drawn according to the linear fade technique of the present invention.

We claim:

1. An improvement to a digitizing oscilloscope, said digitizing oscilloscope having a plurality of input channels, a display, a display memory, and a display control, said display control drawing a current waveform and a plurality of prior waveforms on said display from each of said plurality of input channels in a different color, each of said plurality of input channels having a different color assigned to it, all of said waveforms being formed by a plurality of pixels on said display, said improvement comprising:

means in said display memory for providing for each input channel a separate gray scale binary field of at least two bits for each of said plurality of pixels in each of said current and plurality of prior waveforms, means receptive of each said gray scale binary field from said providing means for converting the binary value in each said gray scale binary field to a corresponding gray scale analog value, said display receptive of each said gray scale analog value from said converting means for illuminating the corresponding pixel in said different color to the degree of brightness determined by the corresponding gray scale binary value so as to display said current waveform at full brightness in said different color and all of said plurality of prior waveforms in said different color for each input channel, said converting means further generating a unique overlap color when waveforms of colors from two or more channels overlap on the same pixel, said unique overlap color being dissimilar from the aforesaid colors, means connected to said display memory and to said display control for decrementing prior to each said display, in a predetermined cycle of time, the binary value in all of the gray scale binary fields of said current waveform and each of said prior waveforms for each input channel by a predetermined binary value, said decremented gray scale binary fields replacing, in each said predetermined cycle of time, all of said gray scale binary fields in said providing means, said display displaying each of said prior waveforms with the same degree of brightness in said different color and with each earlier prior waveform having a lower degree of brightness in said different color so as to display the direction of said current waveform with respect to said prior waveforms, means connected to said display control and responsive to a manual input for providing said predetermined cycle of time.

2. The improvement of claim 1 wherein said predetermined value is a constant binary value for each prior waveform displayed so as to provide a linear fade for said plurality of prior waveforms for each of said plurality of input channels.

3. The improvement of claim 1 wherein said converting means comprises:
   means receptive of each said gray scale binary field from said providing means for assigning viewing priority on said display of said current waveform and said plurality of prior waveforms for each input channel,
   means receptive to each said viewing prioritized gray scale binary field from said assigning means for changing the aforesaid binary field into said corresponding gray scale analog value.

4. The improvement of claim 3 wherein said assigning means is a priority encoding random access memory containing a look-up table.

5. The improvement of claim 3 wherein said changing means comprises:
   a color look-up table, and
   a plurality of digital to analog converters.

6. The improvement of claim 1 wherein said decrementing means comprises:
   address select and sequencing logic,
   read/write control logic,
   control registers,
   decrementer look-through table,
   decrementer address latch,
   said address select and sequencing logic controlled by said control registers to selectively address each providing means and to separately deliver each gray scale binary field into said decrementer address latch, said read/write control logic controlling said decrementer look-through table to selectively read each gray scale binary field delivered into said decrementer address latch and to write a corresponding decremented gray scale binary field contained in said decrementer look-through table so as to replace the gray scale binary field in said display memory at said selective address.

7. The improvement of claim 1 wherein said converting means generates said unique overlap color at a full degree of brightness.

8. The improvement of claim 1 wherein said converting means generates said overlap color at a degree of brightness corresponding to the degree of brightness of a selected one of said overlapping waveforms.

9. The improvement of claim 1 wherein said predetermined value provides non-linear fade for said plurality of prior waveforms for each of said plurality of input channels.

* * * * *